(12) United States Patent
Williamson et al.

(10) Patent No.: US 7,737,701 B2
(45) Date of Patent: Jun. 15, 2010

(54) METHOD AND TESTER FOR VERIFYING THE ELECTRICAL CONNECTION INTEGRITY OF A COMPONENT TO A SUBSTRATE

(75) Inventors: Eddie L Williamson, Fort Collins, CO (US); Tak Yee Kwan, Mississauga (CA)

(73) Assignee: Agilent Technologies, Inc., Santa Clara, CA (US)

( * ) Notice: Subject to any disclaimer, the term of this patent is extended or adjusted under 35 U.S.C. 154(b) by 431 days.

(21) Appl. No.: 11/862,189

(22) Filed: Sep. 26, 2007

(65) Prior Publication Data

US 2009/0079440 A1    Mar. 26, 2009

(51) Int. Cl.
*G01R 31/04*     (2006.01)
*G01R 31/08*     (2006.01)

(52) U.S. Cl. .................................. 324/527; 324/538
(58) Field of Classification Search .............. 324/76.11, 324/527, 523, 519, 512, 500, 538, 66; 714/43
See application file for complete search history.

(56) References Cited

U.S. PATENT DOCUMENTS

| | | | | |
|---|---|---|---|---|
| 3,803,355 A | * | 4/1974 | Fiedler et al. ............... 375/224 |
| 4,241,304 A | * | 12/1980 | Clinton ....................... 324/516 |
| 4,331,843 A | * | 5/1982 | Tarr et al. ....................... 379/3 |
| 4,663,775 A | * | 5/1987 | Olek ............................ 379/24 |
| 5,029,274 A | * | 7/1991 | Goff et al. ..................... 324/66 |
| 5,254,953 A | | 10/1993 | Crook et al. |
| 5,606,480 A | * | 2/1997 | Nevo ............................ 361/46 |
| 6,104,198 A | | 8/2000 | Brooks |
| 6,507,737 B1 | * | 1/2003 | Laham et al. ............... 455/423 |
| 6,842,868 B1 | * | 1/2005 | Brown et al. ................. 714/43 |
| 6,859,041 B2 | * | 2/2005 | Styles ........................ 324/523 |
| 6,937,944 B2 | * | 8/2005 | Furse et al. ................... 702/58 |
| 6,995,318 B2 | * | 2/2006 | Kirschenbaum ......... 174/117 F |
| 2007/0116184 A1 | * | 5/2007 | Gonsalves et al. ......... 379/1.01 |

* cited by examiner

*Primary Examiner*—Hoai-An D Nguyen

(57) ABSTRACT

A method for verifying the integrity of the electrical connection between at least one signal path of a substrate and at least one respective contact of a component mounted on the substrate is disclosed. The method includes generating a step signal on one of the at least one signal path connected to a respective contact, and capturing a capacitively coupled signal due to the step signal at the contact. The method further includes determining the integrity of the electrical connection from a characteristic of the capacitively coupled signal or a response signal obtained from the capacitively coupled signal. A tester in which the method is implemented is also disclosed.

25 Claims, 9 Drawing Sheets

METHOD AND TESTER FOR VERIFYING THE ELECTRICAL CONNECTION INTEGRITY OF A COMPONENT TO A SUBSTRATE

BACKGROUND

Small and compact printed circuit assemblies (PCA) with miniature surface mount technology (SMT) components and custom application-specific integrated circuits (ASICs) installed on dual-sided, multi-layer printed circuit boards (PCBs) are now common. The spacing between the pins of the components becomes smaller as the designs are made to fit into smaller physical configurations. The physical spacing, such as pin spacing and wire trace spacing, is further reduced when the assembly is intended to be portable, such as an assembly for a modem designed to support the Personal Computer Memory Card International Association (PCMCIA) standard.

It is often difficult to determine if a component has been installed correctly in such a crowded and densely populated PCA. More particularly stated, it is often difficult to determine the integrity of the electrical connection between the wire traces of the PCB and the pins or leads of the installed component. The component may be an electronic device or a connector. One method of testing a PCA involves the use of a "bed of nails" test fixture with a conventional in-circuit tester, such as a 3070 Board Tester manufactured and distributed by Agilent Technologies of Santa Clara, Calif. The bed of nails test fixture provides a number of contact probes for accessing test points on the PCA. For the test method to work, there must be contact between the probes of the fixture and the component or signal paths on the PCA. The method is often called a "bed of nails" testing method because the probes are typically sharp metal contact probes configured so that the PCA can be placed on the "bed of nails" and tested. In this manner, the probes touch or access various parts of the component or the signal paths on the PCA and thereby allow measurements to be made.

Typically, the component is stimulated through signals provided through the probes. Measurements obtained from the component via other probes are then compared to "correct" values to determine if the component on the PCA is installed correctly. However, the test probes must be in contact with the appropriate signal paths for this testing method to work. Densely populated printed circuit assemblies often have inaccessible signal paths, such as wire traces beneath multiple layers on the printed circuit board assembly, thereby hampering the use of such a "bed of nails" test fixture. Therefore, "bed of nails" test fixtures are often ineffective when attempting to test a densely populated PCA.

A non-contact testing method for testing the integrity of a device's connections is capacitive testing. An example of capacitive testing is disclosed in U.S. Pat. No. 5,254,953; Crook et al., entitled "Identification of Pin-Open Faults by Capacitively Coupling through the Integrated Circuit Package". In this patent, a system is disclosed for determining whether pins of an integrated circuit (IC) device are properly soldered to a printed circuit board (PCB) of a printed circuit assembly (PCA). A capacitive sensor is positioned over the IC device while a test probe contacts a pin under test via a pad and a connection between the pin and the pad. A 0.2 volt 10 kHz alternating current (AC) test signal is injected via the test probe into the pad connected to the pin under test. The capacitive sensor then detects this test signal via the capacitive coupling between the pin and the bottom of the capacitive sensor. The capacitive sensor converts the AC signal to an intermediate signal called a detection signal, by low-pass filtering the AC signal. The value of the detection signal is proportional to the detected amplitude of the AC signal. In this manner, the value of the detection signal from the capacitive sensor may be compared to a threshold value to determine characteristics about the detected AC signal (such as the strength of the AC signal). If the electrical connection between the test probe, the pad, and the pin under test is open, the value of the detection signal will be much smaller than anticipated. An in-circuit tester (not shown) connected to the capacitive sensor then indicates that the PCA has failed the test and declares that the pin under test is open.

In capacitive testing, several cycles, for example five cycles, of the 10 kHz analog test signal is required to test the integrity of one pin. That is, it takes as long as 500 μsec to test one single pin. Moreover, probe access to the pin under test is still required to apply the test signal for such capacitive testing. Thus capacitive testing would still be ineffective in a circuit assembly where test probe access to the pin under test is not available, such as a densely populated circuit assembly where the pin spacing and wire trace spacing are extremely small.

U.S. Pat. No. 6,104,198; Brooks, entitled "Testing the Integrity of an Electrical Connection to a Device Using an Onboard Controllable Signal Source" discloses the use of an on-board microprocessor or BSCAN device as a controllable signal source for sequentially applying a 10 kHz signal to each pin under test of a device. This solution at least partially eliminates the access problem. However, testing throughput may still be a concern, especially if there are a large number of pins to be tested. Furthermore, the need to generate a 10 kHz signal limits the application of this technique.

BRIEF DESCRIPTION OF DRAWINGS

The invention will be better understood with reference to the drawings, in which.

DETAILED DESCRIPTION OF THE EMBODIMENTS

Figure 1:
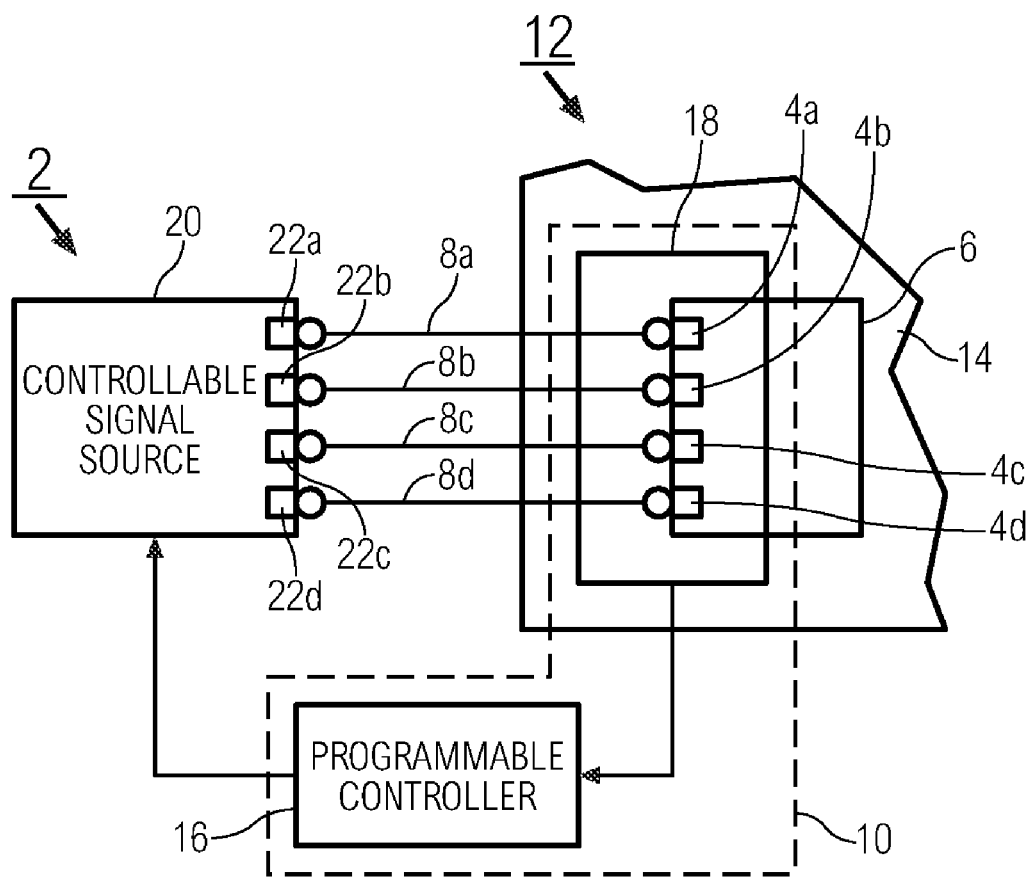
FIG. 1 is a drawing showing a general test system according to one embodiment of the invention for testing the integrity of electrical connection of a component to a substrate.

As shown in the drawings for purposes of illustration, the invention is embodied in a novel method for verifying the integrity of the electrical connection between at least one signal path of a substrate and at least one respective contact of a component mounted on the substrate. The component includes but is not limited to an integrated circuit (IC) device, a connector, an active component such as diode, transistor, FET and a passive component such as a capacitor, capacitor pack, a resistor or a resistor pack. Indexed testing or coupon testing known to those skilled in the art for determining the value of a resistor may additionally be performed to determine if a resistor pack having the correct resistor value is placed on the substrate. The resistor pack may be connected to signal paths between two components or used as pull up, pull down or termination resistors. The substrate may be a printed circuit board (PCB), a flexible circuit or the like. The signal path may be on the surface of or embedded in the substrate. In general, the integrity of the electrical contact is determined by whether the electrical contact, such as a pin or solder pad of the component, is properly connected to the signal path of the substrate. An example of a good electrical connection of an electrical contact is one where the electrical contact is properly soldered to only the appropriate signal path of the substrate. A bad electrical connection for an electrical contact is one where the electrical contact is improperly soldered to result in either an open circuit or a short circuit on the substrate, or the signal path of the substrate to which the electrical contact is to be soldered to is broken or shorted to another signal path. Generally, the method includes generating a step signal on one of the at least one signal path connected to a respective contact, capturing a capacitively coupled signal due to the step signal at the contact, and determining the integrity of the electrical connection from a characteristic of the capacitively coupled signal or a response signal obtained from the capacitively coupled signal. The method allows for relatively quick detection of a bad electrical connection, where there may or may not be probe access to the substrate. The use of a step signal allows this method to be used for verifying the electrical connection integrity of many circuit components in different circuit topologies under different testing situations.

FIG. 1 is a block diagram of a general test system 2 according to an embodiment of the invention for implementing the above described method to test the integrity of the electrical connection of a number of electrical contacts 4a-4d of a component 6 to respective signal paths 8a-8d of a PCB 14 without requiring probe access to the electrical contacts 4a-4d or the signal paths 8a-8d. The system 2 includes a tester 10 and a printed circuit assembly (PCA) 12 under test. The PCA 12 includes the printed circuit board (PCB) 14 with signal paths thereon or therein, and the component 6 having electrical contacts 4a-4d soldered to the appropriate signal paths 8a-8d. The tester 10 includes a programmable controller 16 and a capacitive sensor 18 connected to the programmable controller 16. The programmable controller 16 is also connected to a controllable signal source 20 which may be a part of the tester 10, a fixture (not shown) connected to the tester 10 or the PCA 12. The controllable signal source 20 may be an integrated circuit (IC) soldered onto the PCB 14. Such an integrated circuit (IC) includes but is not limited to a microprocessor, a microcontroller, an in-circuit emulator therefor, a field programmable gate array (FPGA), a boundary scan (BSCAN) device, a memory device or a logic gate device. Test signal output leads 22a-22d of the controllable signal source 20 may be directly electrically connected to the signal paths 8a-8d as shown in FIG. 1 or through passive components such as but not limited to resistors or capacitors (not shown). Alternatively, the controllable signal source 20 may be connected to control another IC (not shown) that is in turn connected to the signal paths 8a-8d.

Figure 2:
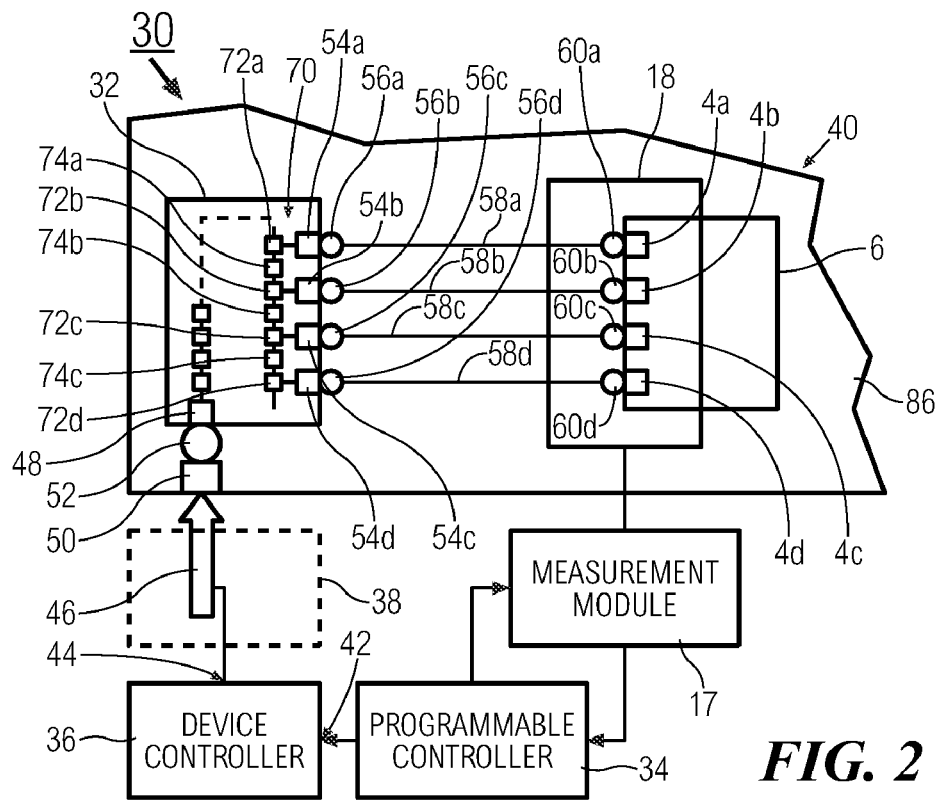
FIG. 2 is a drawing showing a specific in-circuit test system according to an embodiment of the invention.

During use to test the integrity of the electrical connection between the contacts 4a-4d of the component 6 and the signal paths 8a-8d of the PCB 14, the capacitive sensor 18 is placed proximate to the component 6. In other words, the capacitive sensor 18 is placed either close to or in contact with a housing (not shown) of the component 6 such that the capacitive sensor 18 is spaced apart from the contacts 4a-4d to be able to capacitively pick up a signal thereat. The programmable controller 16 commands the signal source 20 to output a step signal on each of its test signal output lead 22a-22d so as to introduce the step signal via a respective signal path 8a-8d to a contact 4a-4d under test. When the signal source 20 outputs the step signal, the programmable controller 16 captures a capacitively coupled signal using the capacitive sensor 18. The programmable controller 16 then determines the integrity of the electrical connection of the electrical contact 4a-4d based on one or more characteristics of the capacitively coupled signal. Alternatively, the programmable controller 16 may also determine the integrity of the electrical connection based on one or more characteristics of a response signal obtained by passing the capacitively coupled signal through a measurement module 17 (FIG. 2). For example, the response signal may be a damped response signal obtained by amplifying the capacitively coupled signal using an amplifier circuit in the measurement module 17. This damped response signal may be an under-damped, an over-damped or a critically-damped signal. The characteristics of either the capacitively coupled signal or the response signal include, but are not limited to, the amplitude, phase, timing, and frequency of the signal, and in some embodiments, the number of transitions in the response signal. The sequence 90 (FIG. 4) of steps for verifying electrical connection integrity will be described in more detail shortly.

In one embodiment, determining the integrity of the electrical connection may include digitizing the response signal to obtain samples thereof and performing digital signal processing on the samples to obtain the characteristic of the response signal. For example, the programmable controller 16 may perform Discrete Fourier Transform (DFT) on the samples to obtain the amplitude of a characteristic frequency component of the response signal. This amplitude may then be used for determining if the electrical connection is good or bad. Other forms of digital signal processing that may be used include, but are not limited to, Fast Fourier Transform (FFT) and filtering using a digital filter such as a Finite Impulse Response (FIR) filter and an Infinite Impulse Response (IIR) filter. The necessary analogue to digital (A/D) conversion and the digital signal processing may be carried out by the measurement module 17 or the programmable controller 16. Digital signal processing may be performed by hardware, firmware, software or a combination thereof.

When testing the integrity of the electrical connection of more than one contact, a step signal may be applied to the contacts 4a-4d one by one in sequence and the corresponding response signal portion may be captured using the capacitive sensor 18. In this case, the response signal includes a number of response signal portions. There is a one to one correspondence between a step signal applied to a contact and a response signal portion. The step signals for determining electrical connection integrity of a number of contacts need not be in any particular sequence so long as the transition in the step signal for one contact does not coincide with the transitions in the step signals for the other contacts. From the respective response signal portion, the programmable controller 16 is able to determine if the electrical connection involving a contact 4a-4d is good or bad. In this manner, the integrity of electrical connection of each contact 4a-4d may in turn be verified. Since the result of the verification is dependent on the step signal reaching the contact under test and no other contacts of the component, it should be appreciated that a component having an output enable (OE) pin and a chip select (CS) pin should have those pins appropriately controlled when generating the step signals so that no undesirable signals appear at the other contacts to be picked up by the capacitive sensor. It is also possible to verify the electrical connection of the contacts 4a-4d all at once. In order to do so, a step signal is applied to each electrical contact 4a-4d simultaneously. In this case the capacitively coupled signal captured by the capacitive sensor is a result of a combination of the simultaneously applied step signals at all the contacts 4a-4d. The magnitude of such a capacitively coupled signal is larger than the magnitude of the signal portion due to a step signal at a single contact. A combination of sequential test and simultaneous test may be used for example in functional testing. Simultaneous testing is carried out first to determine if the electrical connection of all the contacts is good. If that is the case, it may not be necessary to perform the sequential test. However, if it is determined that not all the electrical connections are good, the sequential test is then carried out to determine which of the electrical connections are bad.

Figure 11:
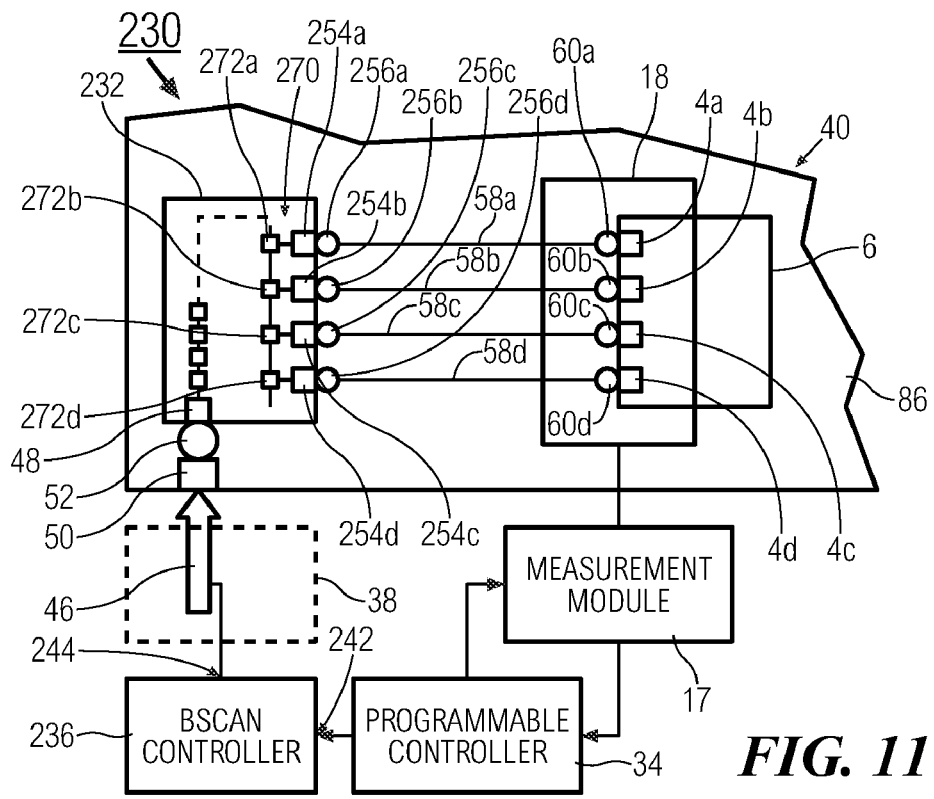
FIG. 11 is a drawing showing a specific in-circuit test system according to yet a further embodiment of the invention.

FIG. 11 shows an in-circuit test system 230 according to another embodiment that includes a device 232, which supports the IEEE 1149.1 Standard Test Access Port and Boundary Scan (BSCAN) Architecture, as the controllable signal source. This BSCAN device 232 can therefore generate the step signals. The test system 230 further includes a programmable controller 34, a BSCAN controller 236, a bed of nails test fixture 38 and a capacitive sensor 18. In one embodiment, the programmable controller 34 is a computer that controls the operation of the in-circuit test system 230 and is capable of controlling and positioning the capacitive sensor 18 with respect to a populated PCA 40.

The programmable controller 34 controls the BSCAN device 232 through the BSCAN controller 236 and the test fixture 38. The BSCAN controller 236 is basically an interface circuit responsive to commands from the programmable controller 34. The BSCAN controller 236 receives commands from the programmable controller 34 on a controller input 242 and, in response, provides a control signal on a controller input/output (I/O) 244. The controller I/O 244 is connected to a test probe 46 of the test fixture 38. The BSCAN device 232 has an I/O lead (or leads) 48 which is connected to a contact pad or test point 50 via an electrical connector 52. The probe 46 contacts the test point 50. Although one such test point 50 is illustrated, it is known that the BSCAN device 232 requires more than one I/O signal (e.g. TCK, TMS, TDI, TDO) and thus a corresponding number of test points 50 are required. The I/O signal is applied to the input lead 48 of the BSCAN device 232, through the contact probe 46, the test point 50, and the connector 52. In this manner, the programmable controller 34 is operable to initiate generation of the step signal at a selected test signal output lead 254a-254d of the BSCAN device 232.

The BSCAN device 232 only functions as a controllable signal source during the electrical connection integrity test. This same BSCAN device 232 operates as another part of the PCA 40 during normal operation. Each test signal output lead 254a-254d of the BSCAN device 232 is connected, via a first electrical connector 256a-256d, to an electrical signal path 58a-58d to which the electrical contact 4a-4d of the component 6 is also connected via a second electrical connector 60a-60d. Thus, the step signal generated by the BSCAN device 232 can be applied to the electrical contact 4a-4d of the component 6 even though the signal path 58a-58d maybe inaccessible to a test probe.

Figure 12:
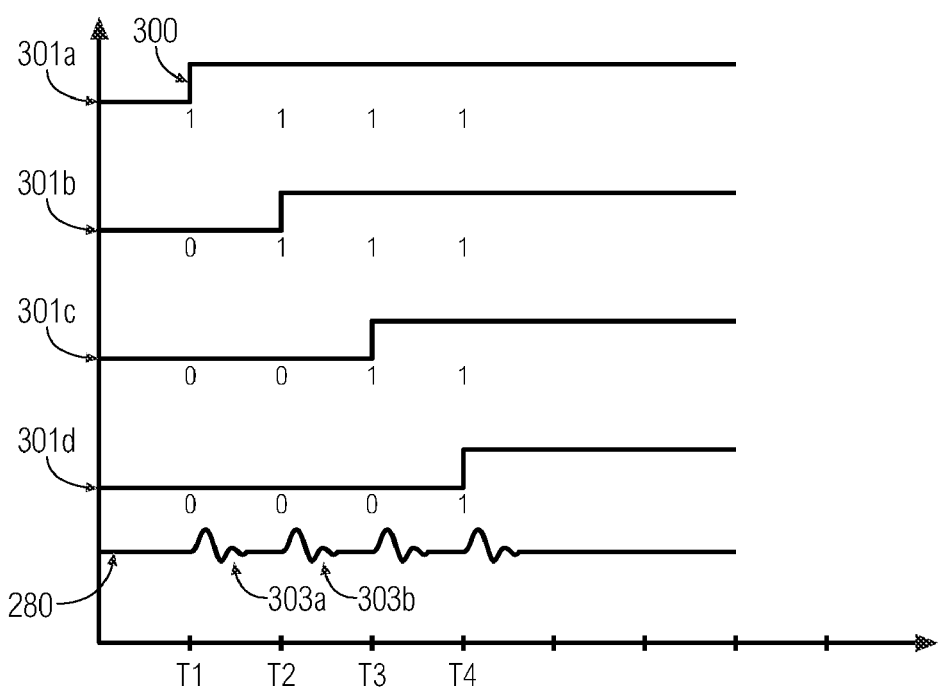
FIG. 12 is a timing diagram associated with testing using the in-circuit test system in FIG. 11.

The BSCAN device 232 includes a chain 270 of output cells 272a-272d connected to the test signal output leads 254a-254d. When the programmable controller 34 instructs the BSCAN controller 236 to control the BSCAN device 232 to generate a step signal, energy from the contact 4a-4d coupled through to the capacitive sensor 18 allows the capacitive sensor to pick up a capacitively coupled signal (not shown). A sensor amplifier in a measurement module 17 connected between the capacitive sensor 18 and the programmable controller 34 converts the capacitively coupled signal to a response signal 280 (FIG. 12). In this embodiment, the measurement module 17 carries out digital signal processing on the response signal 280 as described above. The measurement module 17 and the capacitive sensor 18 may reside on the fixture 38, although they are shown to be separate from the fixture 38 in FIG. 11.

While only a single capacitive sensor 18 is illustrated in FIG. 11, the invention may be practiced using a group of sensors (not shown), with the illustrated capacitive sensor 18 being a selected one of the group of sensors. In this manner, the programmable controller 34 is capable of selecting the particular capacitive sensor 18 necessary to determine the integrity of the electrical connection between the electrical contacts 4a-4d of the component 6 and the signal paths 58a-58d of a PCB 86. It is also possible to simultaneously capture and process another response signal obtained from another component (not shown) connected in parallel to the component 6 using a separate capacitive sensor so as to speed up electrical connection integrity testing of PCB 86. It should be noted that the characteristics of the capacitively coupled signal depend on the characteristics, such as physical size, of the capacitive sensors. The capacitively coupled signal may also be affected by noise. Thus, the capacitance of the capacitive sensor 18 may be changed by connecting/disconnecting one or more capacitors to/from the capacitive sensor 18. Alternatively or additionally, the measurement module 17, more specifically the amplifier and/or the DSP thereof, may be configured to process the capacitively coupled signal so as to increase the integrity of the response signal. Instead of having a capacitive sensor for each component, it is also possible to have one capacitive sensor straddling more than one component.

Figure 10:
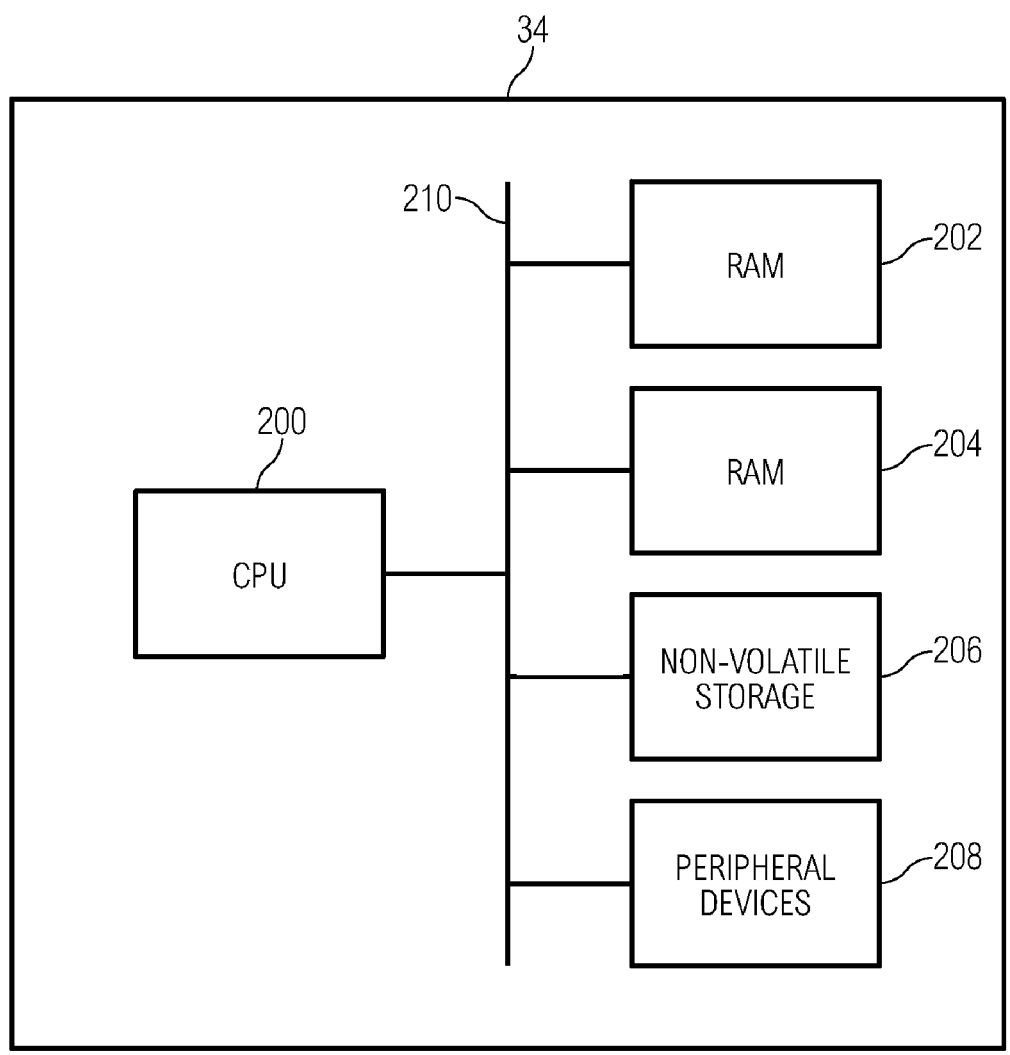
FIG. 10 is a generic block diagram of a programmable controller in the test system of FIG. 1.

With reference to FIG. 10, the programmable controller 34 generally includes a central processing unit (CPU) 200 that is coupled to a random access memory (RAM) 202, a read only memory (ROM) 204, a non-volatile storage unit 206 and other peripheral devices 208 via an internal bus 210. The bus 210 carries data signals, control signals and power to the various components of the programmable controller 34. The non-volatile storage unit 206 may be a floppy disk, a compact disc (CD), a chip card or a hard disk. The other peripheral devices 208 may include a display, a keyboard, a mouse, and other device-specific components (all not shown). The display may be a video display, LCD display, touch-sensitive display, or other display types. The ROM 204 or the non-volatile storage unit 206 may serve as a program storage device for storing a program of instructions that is executable by the CPU 200 for implementing the respective portion of the sequence 90. The program may be implemented in any high level or low level programming languages.

Figure 13:
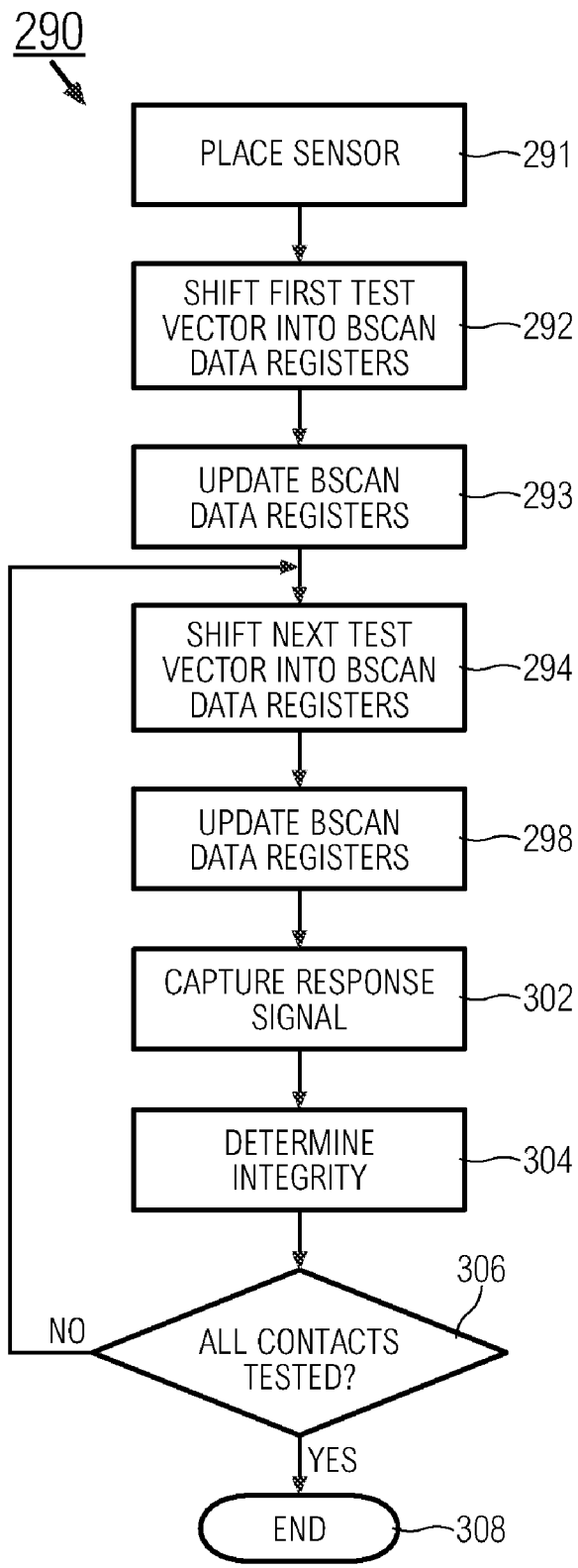
FIG. 13 is a flowchart showing a sequence of steps for testing using the in-circuit test system in FIG. 11.

With the aid of FIGS. 12 and 13, the operation of the in-circuit test system 230 in FIG. 11 will be described in more detail next. FIG. 13 shows a sequence 290 of steps implemented in the in-circuit test system 230 for performing the electrical connection integrity test to determine if there is any open circuit. The sequence 290 starts in a PLACE SENSOR step 292, wherein the capacitive sensor 18 is placed over the electrical contacts 4a-4d of the component 6 to be proximate thereto. In one embodiment, the capacitive sensor 18 is rigidly fixed in a position and the PCA 40 is brought towards the capacitive sensor 18 so that the capacitive sensor 18 is proximate the component 6. However, in an alternative embodiment, the capacitive sensor 18 can be robotically positioned at the desired location in response to a command from the programmable controller 34.

The sequence 290 next proceeds to a SHIFT FIRST TEST VECTOR INTO BSCAN DATA REGISTERS step 292, wherein the programmable controller 34 instructs the BSCAN controller 236 to generate the appropriate I/O signal at its control I/O 44 to shift a first test vector into the register (not shown) of each of the cells of the BSCAN device 232 such that the registers of the output cells 272a-272d are filled with logic zero bits. In a subsequent UPDATE BSCAN DATA REGISTERS step 293, the programmable controller 34 instructs the BSCAN controller 236 to update all the registers of the BSCAN device 232 so that the test signal output leads 254a-254d are brought to a logic zero level. The sequence 290 next proceeds to a SHIFT NEXT TEST VECTOR INTO BSCAN DATA REGISTERS step 294, wherein the programmable controller 34 instructs the BSCAN controller 236 to shift a next test vector into the registers of the cells of the BSCAN device 232. This test vector includes a pattern "1000" which is shifted into the registers of the output cells 272a-272d respectively. The sequence 290 next proceeds to an UPDATE BSCAN DATA REGISTERS step 298, wherein the BSCAN controller 236 commands the BSCAN device 232 to perform an update operation on the registers of the cells of the BSCAN device 232. In doing so, the first test signal output lead 254a connected to the output cell 272a is brought from the logic zero level to a logic one level. The other test signal output leads 254b-254d remain at the logic zero level. In this manner, the BSCAN device 232 is able to generate a rising edge 300 in a step signal 301a at the first test signal output lead 254a. The generation of the step signal 301a is shown to occur at time T1 in FIG. 12.

The sequence 290 next proceeds to a CAPTURE RESPONSE SIGNAL step 302, wherein the programmable controller 34 captures the response signal 280 as a result of the rising edge 300 at the test signal output lead 254a. More specifically, the programmable controller 34 captures a response signal portion 303a in the response signal 280 that is due to the rising edge 300 at the test signal output lead 254a. When the rising edge 300 is applied to a good electrical connection between the test signal output lead 254a and the contact 4a of the component 6, the capacitive sensor 18 will pick up a capacitively coupled signal (not shown). The measurement module 17 amplifies this capacitively coupled signal to obtain the response signal portion 303a. The programmable controller 34 will at the appropriate moment trigger the measurement module 17 to obtain digital samples of this response signal portion 303a and to carry out digital signal processing on the signal portion 303a using the digital samples to in turn obtain an amplitude of a characteristic frequency component of the signal portion 303a. In doing so, the programmable controller may configure the amplifier or modify the digital signal processing according to the characteristics of the capacitive sensor 18. The sequence 290 next proceeds to a DETERMINE INTEGRITY step 304, wherein the programmable controller 34 will determine if the electrical connection between the contact 254a and the signal path 58a is good or bad by comparing the amplitude with a corresponding predetermined threshold value stored therein. More accurately, it is the entire electrical connection between the test signal output lead 254a of the BSCAN device 32 and the contact 4a of the component 6 that is tested.

The sequence 290 next proceeds to an ALL CONTACTS TESTED? decision step 306, wherein the programmable controller 34 determines if all contacts 4a-4d of the component 6 have been tested for electrical connection integrity. If it is determined in this step 306 that all contacts 4a-4d have been tested, the sequence 290 ends in an END step 308. However, if it is determined that there is one or more contacts 4a-4d that are yet to be tested, the sequence 290 returns to the SHIFT NEXT TEST VECTOR INTO BSCAN DATA REGISTERS step 294, wherein the above described steps 294-304 are performed for a next contact 4a-4d under test. In the SHIFT NEXT TEST VECTOR INTO BSCAN DATA REGISTERS step 294, another test vector is shifted into registers of the cells of the BSCAN device 232 such that a pattern "1100" is shifted into the output cells 272a-272d respectively. The registers of the cells of the BSCAN device 232 are once again updated in the UPDATE BSCAN DATA REGISTERS step 298 to result in a rising edge at time T2 in the step signal 301b generated at the second test signal output lead 254b. This step signal 301b is used for checking if there is an open circuit in the electrical connection of the second contact 4b of the component 6. If the electrical connection is good, a corresponding signal portion 303b would appear in the response signal 280. In this manner, a step signal 301a-301d or more specifically a rising edge 300 therein is generated sequentially at the respective test signal output lead 254a-254d to test each of the electrical contacts 4a-4d for an open circuit. In this embodiment, four test vectors are shifted into the registers of the cells such that the patterns "1000", "1100", "1110" and "1111" are shifted into the registers of the output cells 272a-272d for generating the step signals 301a-301d having rising edges that are spaced apart in time.

Figure 3:
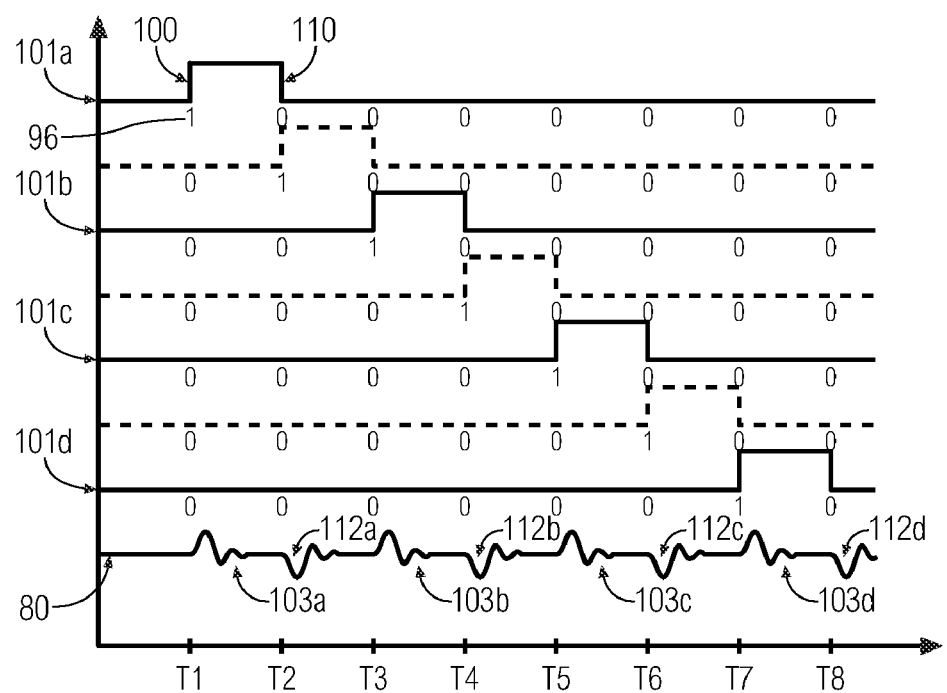
FIG. 3 is a timing diagram associated with testing using the in-circuit test system in FIG. 2.
Figure 9:
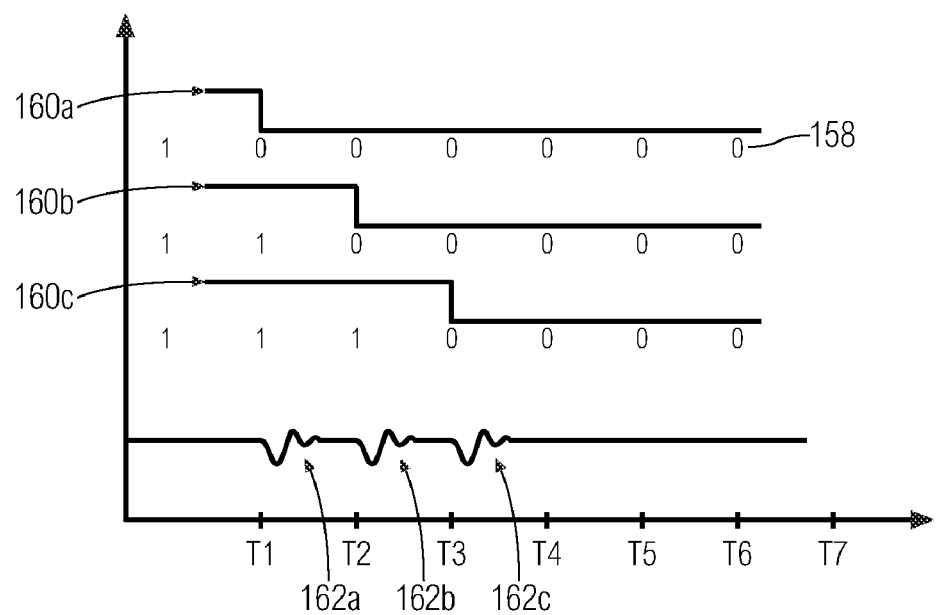
FIG. 9 is a timing diagram associated with testing using the in-circuit test system in FIG. 8.

Although it is described that rising edges in step signals 301a-301d are in turn generated at the test signal output leads 254a-254d, those skilled in the art would readily recognize from such a teaching that failing edges in step signals, as shown in FIG. 9, may also be generated at these test signal output leads 254a-254d for performing the above test. It is also possible for appropriate test vectors to be used in the BSCAN device 232 for generating step signals that are shown in FIG. 3.

Step signals are not limited to generation using a BSCAN device 232 where the registers of cells are updated only when a complete test vector has been shifted into the registers of the cells. It is possible also to generate step signals using a device wherein cells can be updated with each bit shifted into the cells. Such a device includes, but is not limited to, a shift register.

FIG. 2 shows an in-circuit test system 30 according to another embodiment that includes such a device 32 and a corresponding device controller 36. Like the BSCAN device 232 in FIG. 11, the device 32 only functions as a controllable signal source during the electrical connection integrity test. This same device 32 operates as another part of the PCA 40 during normal operation. Each test signal output lead 54a-54d of the device 32 is connected, via the first electrical connector 56a-56d, to the electrical signal path 58a-58d. Thus, the step signal generated by device 32 can be applied to the electrical contact 4a-4d of the component 6 even though the signal path 58a-58d maybe inaccessible to a test probe.

The device 32 includes a chain 70 of output cells 72a-72d connected to the test signal output leads 54a-54d and cells 74a-74c interleaving these output cells 72a-72d. In other words, the interleaving cells 74a-74c are connected alternately and regularly between the output cells 72a-72d. The chain 70 thus includes an interleaving cell 74a-74c between every two adjacent output cells 72a-72d connected to the test signal output leads 54a-54d as shown in FIG. 2. In this embodiment, these interleaving cells 74a-74c are not connected to any lead of the device 32 and are included in the device 32 for the sole purpose of interleaving the output cells 72a-72d. In other embodiments, these interleaving cells 74a-74c may be other input or output cells connected to other leads of the device 32.

Figure 4:
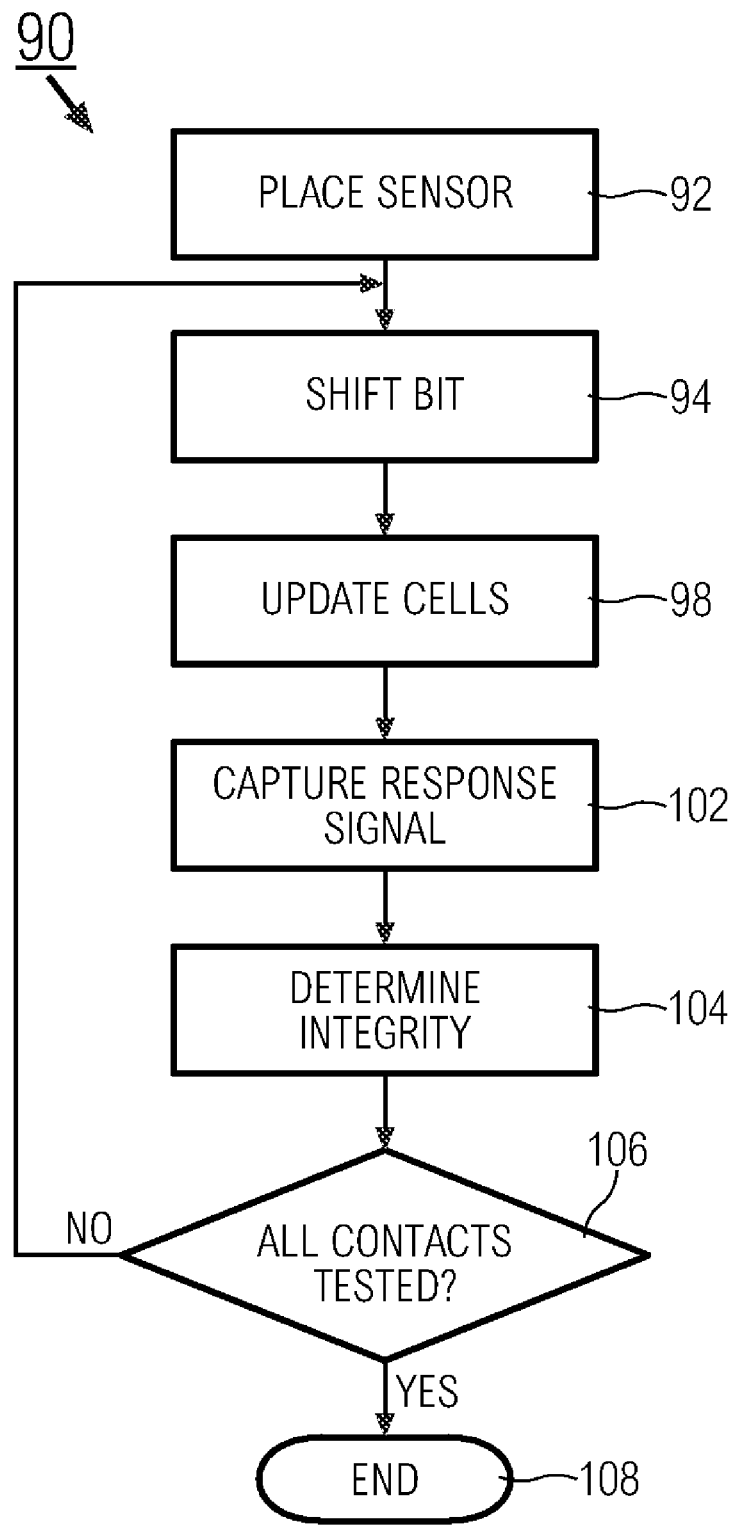
FIG. 4 is a flowchart showing a sequence of steps for testing using the in-circuit test system in FIG. 2.

With the aid of FIGS. 3 and 4, the operation of the in-circuit test system 30 in FIG. 2 will be described in more detail next. FIG. 4 shows a sequence 90 of steps implemented in the in-circuit test system 30 for performing the electrical connection integrity test to determine if there is any open circuit. The sequence 90 starts in a PLACE SENSOR step 92, wherein the capacitive sensor 18 is placed over the electrical contacts 4a-4d of the component 6 to be proximate thereto.

The sequence 90 next proceeds to a SHIFT BIT step 94, wherein the programmable controller 34 sends a command to the device controller 36 in order to cause the device controller 36 to generate the appropriate control signal at its control I/O 44. The control signal is then applied to the input lead 48 of the onboard device 32. First, a logic zero is shifted into all the output cells 72a-72d to set all test signal output leads 54a-54d to logic zero. The device controller 36 then shifts a logic one bit 96 (FIG. 3) to a first output cell 72a connected to a first test signal output lead 54a of the device 32. The sequence 90 next proceeds to an UPDATE CELLS step 98, wherein the device controller 36 commands the device 32 to perform an update operation on the cells 72a-72d, 74a-74c. The device 32 is thus able to generate a rising edge 100 in a step signal 101a at the first test signal output lead 54a.

The sequence 90 next proceeds to a CAPTURE RESPONSE SIGNAL step 102, wherein the programmable controller 34 captures a response signal portion 103a in a response signal 80 that is due to the rising edge 100 at the test signal output lead 54a. When the rising edge 100 is applied to a good electrical connection between the test signal output lead 54a and the contact 4a of the component 6, the capacitive sensor 18 will pick up a capacitively coupled signal (not shown). The measurement module 17 amplifies this capacitively coupled signal to obtain the response signal portion 103a and carries out digital signal processing on the digital samples to obtain an amplitude of a characteristic frequency component of the signal portion 103a. The sequence 90 next proceeds to a DETERMINE INTEGRITY step 104, wherein the programmable controller 34 will determine if the electrical connection between the contact 54a and the signal path 58a is good or bad by comparing the amplitude with a corresponding predetermined threshold value stored therein.

The sequence 90 next proceeds to an ALL CONTACTS TESTED? decision step 106, wherein the programmable controller 34 determines if all contacts 4a-4d of the component 6 have been tested for electrical connection integrity. If it is determined in this step 106 that all contacts 4a-4d have been tested, the sequence 90 ends in an END step 108. However, if it is determined that there is one or more contacts 4a-4d that are yet to be tested, the sequence 90 returns to the SHIFT BIT step 94, wherein the above described steps are performed for a next contact 4a-4d under test. When the logic one bit 96 is shifted into the first interleaving cell 74a in the SHIFT BIT step 94 and the cells 72a-72d, 74a-74c are updated in the UPDATE CELLS step 98 at time T2, the step signal at the first test signal output lead 54a will go from a logic high state to a logic low state to define a failing edge 110 in the step signal 101a. This failing edge 110 similarly causes another signal portion 112a in the response signal 80. However, the programmable controller 34 ignores this signal portion 112a and bypasses the CAPTURE RESPONSE SIGNAL step 102 and DETERMINE INTEGRITY step 104 since the contact 4a has been tested earlier using the rising edge 100 in the step signal 101a. However, this signal portion 112a may also be used to further check if the result obtained earlier is correct. During time T2, the interleaving cell 74a between the first output cell 72a and the second output cell 72b will go to a logic one state. If this interleaving cell 74a is not present, the logic one bit 96 would be shifted into the second output cell 72b causing a rising edge 100 at the second test signal output lead 54b at the same time as the failing edge 110 at the first test signal output lead 54a. As a result of this coincidence of the rising edge 110 and the failing edge 112 of the two step signals 101a, 110b, there will be little or no response signal portion as the effects of the rising edge 110 and the failing edge 110 cancel each other out at the capacitive sensor 18. In other words, the signal portion of interest may be non existent. The interleaving cells 74a-74c therefore ensure that the failing edge 110 in the step signal 101a-101d at one test signal output lead 54a-54d does not coincide with the rising edge 100 in the step signal 101a-101d at the adjacent test signal output lead 54a-54d. In the next loop, the logic one bit 96 is shifted to the second output cell 72b in the SHIFT BIT step 94 and when the cells 72a-72d, 74a-74c are updated in the UPDATE CELLS step 98, a rising edge 100 in the step signal 101b is generated at the second test signal output lead 54b for checking if there is an open circuit in the electrical connection of the second contact 4b of the component 6. In this manner, a step signal 101a-101d or more specifically a rising edge 100 therein is generated sequentially at the respective test signal output lead 54a-54d to test each of the electrical contacts 4a-4d for an open circuit. In this embodiment, the logic one bit 96 is shifted and the cells updated at regular intervals to generate spaced-apart rising edges 100 in the step signals 101a-101d. It is also possible to shift a logic zero bit (not shown) through the chain 70 of cells 72a-72d, 74a-74c to perform the above test.

Figure 5:
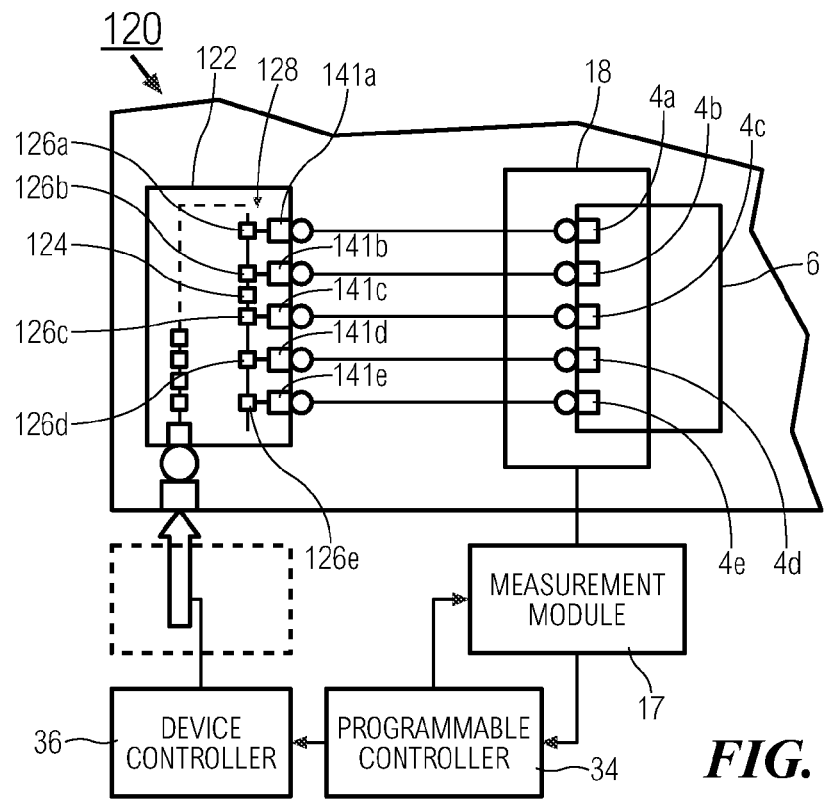
FIG. 5 is a drawing showing a specific in-circuit test system according to another embodiment of the invention.

FIG. 5 shows an in-circuit test system 120 similar to that in FIG. 2. The only hardware difference between the two systems 30, 120 lies in the controllable signal source. The system 120 includes a device 122 wherein interleaving cells 124 (only one is shown) are not cells that are added solely for that purpose. Thus additional silicon, which is required in the case of the device 32 in FIG. 2, is not necessary here. In this device 122, interleaving cells 124 are cells connected to other leads (not shown) of the device 122 that are not connected to the contacts 4a-4e of the component 6. The interleaving cell 124 in FIG. 5 is shown connected between a second output cell 126b and a third output cell 126c. Testing of the integrity of the electrical connection of the contacts 4a-4e is no longer performed by shifting a single logic one bit through a chain 128 of cells 124, 126a-126e. Instead, several logic one bits 129a-129c have to be shifted through the chain 128 of cells 124, 126a-126e to test all contacts 4a-4e for electrical connection integrity.

Figure 6:
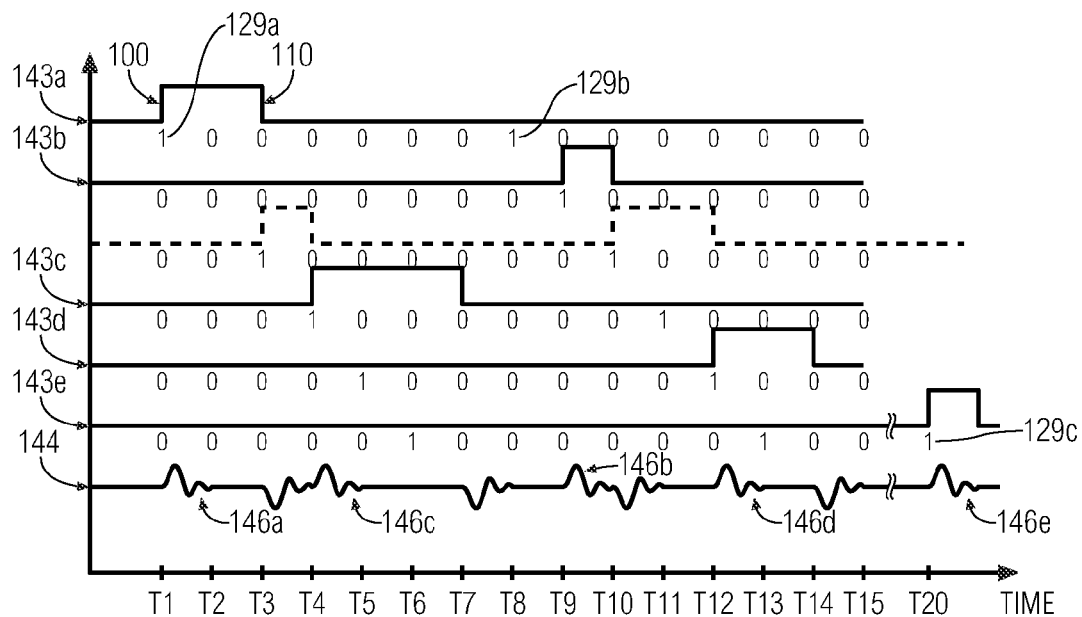
FIG. 6 is a timing diagram associated with testing using the in-circuit test system in FIG. 5.
Figure 7:
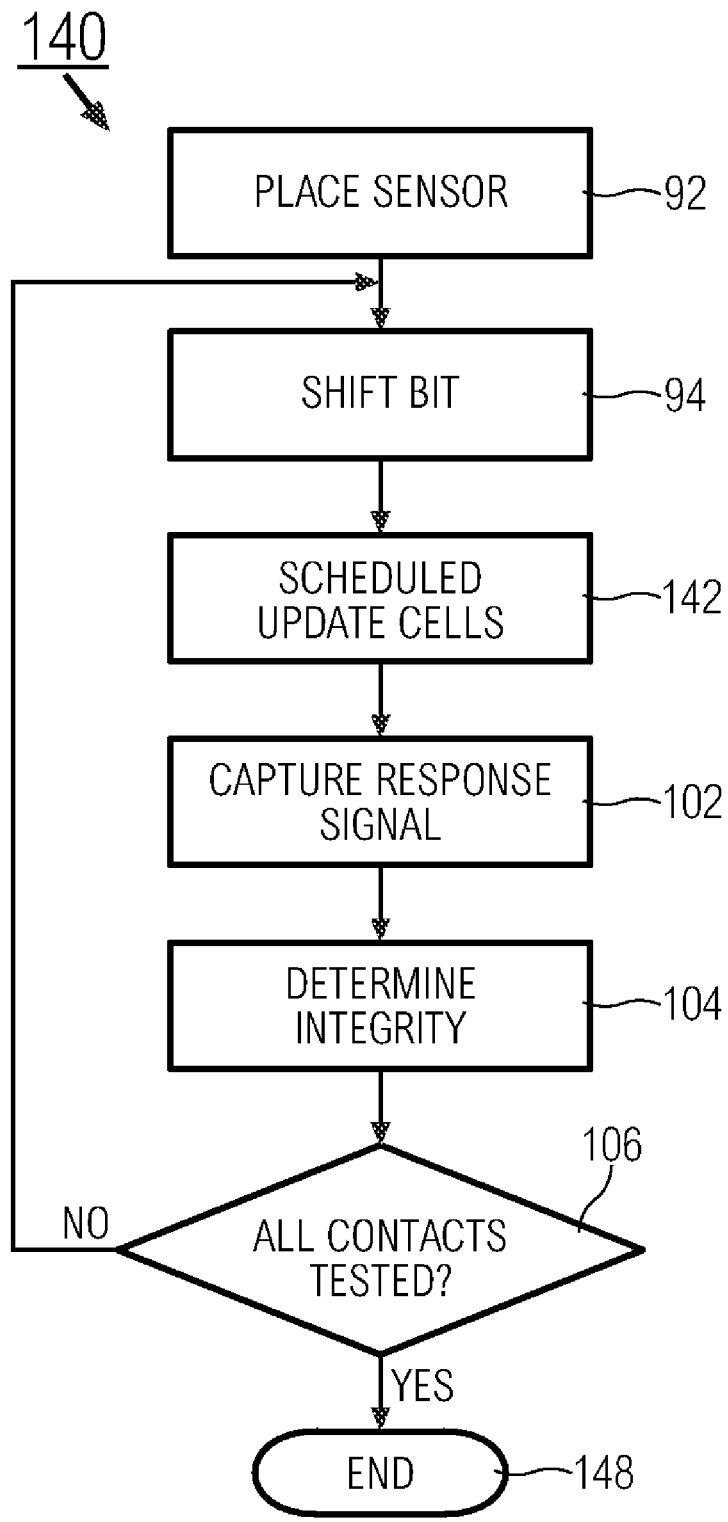
FIG. 7 is a flowchart showing a sequence of steps for testing using the in-circuit test system in FIG. 5.

The operation of the in-circuit test system 120 is described with the aid of FIG. 6 and FIG. 7 which shows a sequence 140 of steps for checking for open circuits in the electrical connection of a component 6. Most of these steps are similar to those in FIG. 4 and will thus be described only briefly here.

The sequence 140 starts in the PLACE SENSOR step 92, wherein the capacitive sensor 18 is placed over the electrical contacts 4a-4e of the component 6. The sequence 140 next proceeds to the SHIFT BIT step 94, wherein the device controller 36 shifts the first logic one bit 129a to the first output cell 126a connected to a first test signal output lead 141a of the device 122. The sequence 140 next proceeds to a SCHEDULED UPDATE CELLS step 142, wherein the device controller 36 commands the device 122 to perform an update operation on the cells 126a-126e, 124 according to a predetermined schedule. At time T1, the update cells operation is performed so that the device 122 is able to generate a rising edge 100 in a step signal 143a at the first test signal output lead 141a.

The sequence 140 next proceeds to the CAPTURE RESPONSE SIGNAL step 102, wherein the programmable controller 34 obtains the amplitude of a characteristic frequency component of a response signal 144 as described above whenever there is a rising edge 100 in the step signal 143a-143e at any of the test signal output lead 141a-141e. The programmable controller 34 will next determine if there is an open circuit in the electrical connection of the first contact 4a in the DETERMINE INTEGRITY step 104 by comparing the amplitude of the characteristic frequency component with a predetermined threshold value.

The sequence 140 next proceeds to the ALL CONTACTS TESTED? decision step 106, wherein the programmable controller 34 determines if all contacts 4a-4e of the component 6 have been tested for electrical connection integrity. If it is determined in this step that all contacts 4a-4e have been tested, the sequence 140 ends in an END step 148. However, if it is determined that there is one or more contacts 4a-4e that are yet to be tested, the sequence 140 returns to the SHIFT BIT step 94 to loop around the above described steps. At time T2, the logic one bit 129a will be shifted to the second output cell 126b. There is however no update of cells at time T2 as determined in the SCHEDULED UPDATE CELLS step 142 and the step signal 143a at the first output test lead 141a will remain at a logic high state at time T2 even though the logic one bit 129a has been shifted out of the first output cell 126a into the second output cell 126b. Since there is no rising edge at any of the test signal output leads 141a-141e, the programmable controller 34 bypasses the CAPTURE RESPONSE SIGNAL and the DETERMINE INTEGRITY steps 102, 104. At time T3, the device 122 is instructed to shift the logic one bit 129a to the interleaving cell 124 between the second and third output cells 126b, 126c in the SHIFT BIT step 94 and to update the cells 130a-130d, 124 as determined in the SCHEDULED UPDATE CELLS step 142. The step signal 143a at the first test signal output lead 141a will go from a logic high state to a logic low state to define a failing edge 110. At this time, the step signal 143b-143e at the other test signal output leads 141b-141e remain at a logic zero state and the programmable controller 34 will thus bypass the CAPTURE RESPONSE SIGNAL and DETERMINE INTEGRITY steps 104, 106. In a next loop when the first logic one bit 129a is shifted to the third output cell 126c in the SHIFT BIT step 94 and the cells 126a-126e, 124 are updated in the SCHEDULED UPDATE CELLS step 142, the step signal 143c at the third test signal output lead 141c will go from a logic zero to a logic one state to define the rising edge 100 in the step signal 143c. The programmable controller 34 will then obtain the amplitude of a characteristic frequency component of the response signal portion 146c in the CAPTURE RESPONSE SIGNAL step 102 and determine the electrical connection integrity of the third contact 4c in the DETERMINE INTEGRITY step 104 as described above. When the first logic one bit 129a is shifted through the fourth output cell 126d and the fifth output cell 126e, no update of cells is carried out in the SCHEDULED UPDATE CELLS step 142. The cells are updated only when the first logic one bit 129a is shifted out of the fifth output cell 126e at time T7. At this time, the step signal 143c at the third test signal output lead 141c goes from the logic high to a logic low state. Thus with the one interleaving cell 124, the electrical connection integrity for two contacts 4a, 4c of the component 6 can be determined with the shifting of the one logic one bit 129a through the chain 128 and updating of the cells at the appropriate times.

A second logic one bit 129b is shifted through the chain 128 of cells 124, 126a-126e for testing the electrical connection integrity of the two other contacts. The cells are updated at times T9, T10 and T12 to cause a rising edge 100 in the step signal 143b, 143d at the second and fourth test signal output leads 141b, 141d as shown in FIG. 6. The programmable controller 34 obtains the amplitude of a characteristic frequency component of each of the response signal portions 146b, 146d and determines the electrical connection integrity of the second and fourth contacts 4b, 4d at time T9 and T12 respectively. Similarly, a third logic one bit 129c is shifted through the chain 128 of cells 124, 126a-126e for testing the fifth contact 4e. As this logic one bit 129c is shifted to the fifth output cell 126e at time T20, the cells are updated in the SCHEDULED UPDATE CELLS step 142 to generate a rising edge 100 in the step signal 143e at the fifth test signal output lead 141e so that a response signal portion 146e may be captured in the CAPTURE RESPONSE SIGNAL step 102 for the electrical connection integrity of the fifth contact 4e to be determined in the DETERMINE INTEGRITY step 104. In this manner, three logic one bits 129a-129c in an appropriate test bit pattern are shifted through the chain 128 of cells for determining the electrical connection integrity of all five contacts 4a-4e of the component 6.

Figure 8:
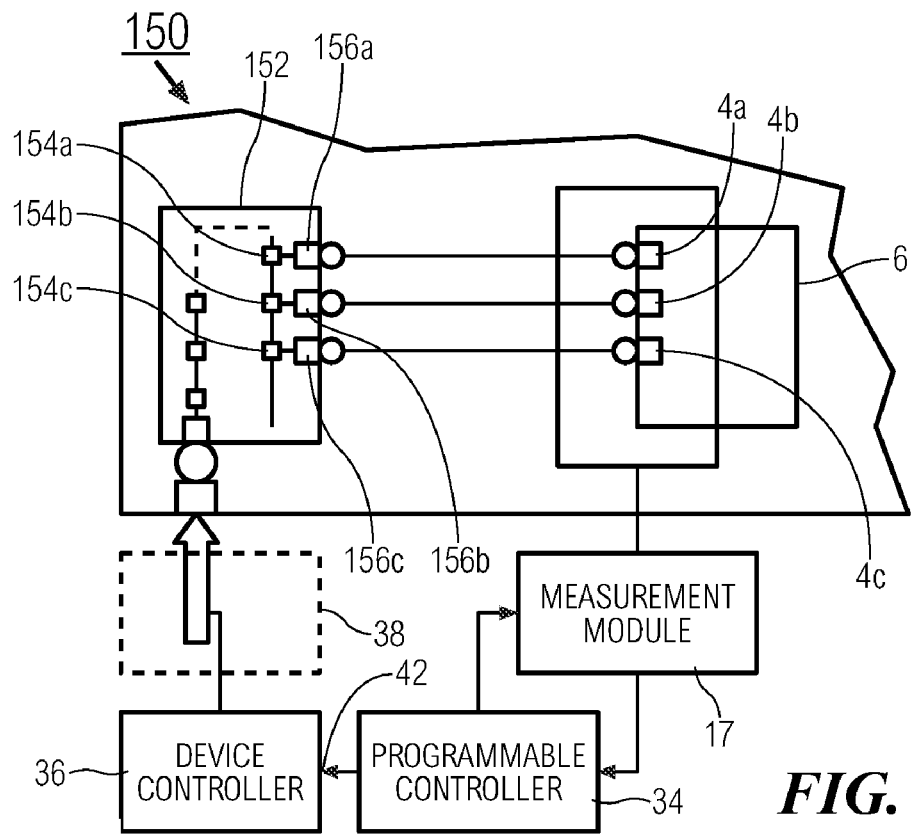
FIG. 8 is a drawing showing a specific in-circuit test system according to yet another embodiment of the invention.

FIG. 8 shows yet another in-circuit test system 150 including another device 152. This device 152 includes output cells 154a-154c connected to respective test signal output leads 156a-156c. There are no interleaving cells between the output cells 154a-154c. Electrical connection integrity testing of the contacts 4a-4c of the component 6, such as testing for open circuits, can be performed using such a device 152 by shifting a suitable test bit pattern 158 through the output cells 154a-154c and updating the output cells 154a-154c at the appropriate times. FIG. 9 shows an example of a suitable test bit pattern 158. A series of logic one bits is shifted to the output cells 154a-154c and the output cells are updated to keep each test output lead 156a-156c at a logic high level. Following that, a series of zero bits is then shifted through the output cells with the cells updated at each shift so that one by one the output test signal leads 156a-156c are brought to a logic level zero to result in a step signal 160a-160c thereat. At each transition from a logic level one to a logic level zero at the test output signal lead, the programmable controller 34 captures a corresponding response signal portion 162a-162c for determining the electrical connection integrity of the respective contact 4a-4c.

Although the present invention is described as implemented in the above described embodiments, it is not to be construed to be limited as such. For example, in addition to use in an in-circuit test system, the method is applicable in other systems including but not limited to a functional test system, a manufacturing defects analyzer (MDA) system, and a hot mock up test system. As another example, in addition to using signal paths directly connecting the test signal output leads to the contacts for testing the electrical connection integrity therebetween, the invention may be implemented when the signal path includes one or more interconnected components (not shown), such as resistors, capacitors, filters, transistors, ICs or other types of electrical components through which the step signal may propagate.

The electrical connection integrity test is also not to be construed to be limited to a test for open circuits. Those skilled in the art would recognize that the invention may be used to detect other bad electrical connections including, but not limited to, a short to ground, a short to a supply line and a short to another electrical interconnection, such as an adjacent contact or an adjacent signal path. In the latter case, determining electrical connection integrity of a first contact includes putting a second contact adjacent to the first contact to a state that disrupts the step signal at the first contact if the two contacts are shorted. For example, when a step signal going from a logic low to a logic high level is to be used for testing the electrical integrity of a first contact, the second contact may be kept at a logic low level so that in the event of a short circuit, the signal at the first contact will be prevented from going to the logic high level. Consequently, a short circuit would be detectable.

The invention may also be used to test the electrical connection integrity of a pair of contacts connected to a pair signal paths carrying differential signals. In such a case, the electrical connection integrity test includes generating a first step signal on the signal path connected to one contact and a second step signal on the signal path connected to the other contact simultaneously. The first step signal and the second step signal are of opposite polarity. With the respective capacitively coupled signals at least substantially cancelling each other out at the capacitive sensor, the absence of or a small captured response signal would indicate that the electrical connection of both the contacts are good. If any of the electrical connection of the two contacts is bad, there will be a larger captured response signal. However, a condition where both the electrical connections are bad would not be detectable. To be able to detect such a condition, a capacitive sensor having an asymmetric sensor plate may be used. Instead of not producing any response signal when the electrical connections are good, a predetermined differential response signal is now produced. A different response signal than this predetermined differential response signal would indicate that one or both of the electrical connections are bad.

As mentioned above, the invention may be used to verify the electrical connection integrity of a component such as a capacitor pack having a number of capacitors. If two of the capacitors are connected to a pair of differential signals, the sensor plate may be placed over one of the capacitor but not the other capacitor. A differential response signal is produced when both the electrical connections to the capacitors are good. However, if there is any short on either side of the capacitors, a response signal that is different than the expected differential response signal would be produced.

As yet another example, instead of controlling the device and the BSCAN device using a respective controller of the tester, the devices may be controlled using another device on the PCB or the fixture. As yet a further example, the signal source may be one that is not controllable by the programmable controller to generate the step signals but one that generates the step signals on its own during, but not limited to, a built in self test or execution of a downloaded diagnostic test. This device may include an on board oscillator, a switching regulator or the like. When doing so, such a non-controllable signal source would send a trigger signal to the programmable controller to allow the programmable controller to synchronize the capturing of the response signal at the appropriate times. That is, the trigger signal is used to coordinate the generation of the step signals by the signal source and the capturing of the corresponding response signal portions by the programmable controller.

As a further example, the at least one signal path may include a first signal path that is pulled high, pulled low or to a fixed voltage level therebetween via a resistor on a second signal path connected to the first signal path. In other words, there are now two signal paths connected to the contact. The method described above may then be used to verify the electrical connection integrity between these signal paths and the contact. For example, if a contact is pulled high via a pull-up resistor, the test signal output lead may be changed from a low state to a tri-state state to allow the pull-up resistor to pull the test output signal lead high so that a step signal is generated thereat. If there is any open circuit in either of the signal paths, no step signal would be generated and thus no response signal would be produced. Similarly, for a contact that is pulled low, the test signal output lead may be changed from a high state to a tri-state state so that a step signal may be produced thereat for electrical connection integrity verification.

What is claimed is:

1. A method for verifying the integrity of the electrical connection between at least one signal path of a substrate and at least one respective contact of a component mounted on the substrate, the method comprising:
    generating a step signal on one of the at least one signal path connected to a respective contact;
    capturing a capacitively coupled signal due to the step signal at the contact; and
    determining the integrity of the electrical connection from a characteristic of one of the capacitively coupled signal and a response signal obtained from the capacitively coupled signal.

2. A method according to claim 1, wherein the method further comprises obtaining the response signal from the capacitively coupled signal, and wherein determining the integrity of the electrical connection comprises determining the integrity of the electrical connection from a characteristic of the response signal.

3. A method according to claim 2, wherein obtaining the response signal from the capacitively coupled signal comprises obtaining one of an under-damped, an over-damped and a critically-damped signal from the capacitively coupled signal.

4. A method according to claim 2, wherein determining the integrity of the electrical connection from a characteristic of the response signal comprises determining the integrity of the electrical connection from one of an amplitude, a phase, a timing and a frequency of the response signal.

5. A method according to claim 2, wherein determining the integrity of the electrical connection from a characteristic of the response signal comprises:
    digitizing the response signal to obtain samples thereof;
    performing digital signal processing on the samples to obtain the characteristic of the response signal.

6. A method according to claim 5, wherein performing digital signal processing on the samples comprises one of:
    carrying out Discrete Fourier Transform on the samples;
    carrying out Fast Fourier Transform on the samples; and
    filtering the samples using a digital filter.

7. A method according to claim 2, wherein the method further comprises putting a second contact adjacent to the first contact to a state that disrupts the step signal at the first contact if the two contacts are shorted.

8. A method according to claim 2, wherein the at least one contact of the component comprises at least two contacts of the component, and wherein generating a step signal on the signal path comprises generating a step signal simultaneously on each signal path;

capturing a capacitively coupled signal comprises capturing a capacitively coupled signal due to the simultaneously generated step signals; and determining the integrity of the electrical connection comprises determining the integrity of all the electrical connections from a characteristic of the response signal.

9. A method according to claim 2, wherein the at least one contact of the component comprises at least two contacts of the component, and wherein generating a step signal on the signal path comprises generating a step signal in sequence on each signal path;

capturing a capacitively coupled signal comprises capturing a capacitively coupled signal having a respective signal portion due to each step signal; and determining the integrity of the electrical connection comprises determining the integrity of the electrical connection of each contact from a characteristic of the corresponding signal portion of the response signal.

10. A method according to claim 2, wherein the at least one contact of the component comprises at least two contacts of the component, and wherein generating a step signal on the signal path comprises generating a first step signal on the signal path connected to one contact and a second step signal on the signal path connected to another contact simultaneously; the first step signal and the second step signal being of opposite polarity; and capturing a capacitively coupled signal comprises capturing a capacitively coupled signal due to the simultaneously generated step signals.

11. A method according to claim 10, wherein capturing a capacitively coupled signal due to the simultaneously generated step signals comprises capturing a capacitively coupled signal due to the simultaneously generated step signals differentially.

12. A method according to claim 2, wherein the at least one contact of the component comprises at least two contacts of the component, and wherein generating a step signal on the signal path comprises generating a first step signal on the signal path connected to one contact and a second step signal on the signal path connected to another contact simultaneously; the first step signal and the second step signal being of opposite polarity; and capturing a capacitively coupled signal comprises capturing a capacitively coupled signal due to only one of the two simultaneously generated step signals.

13. A method according to claim 2, wherein obtaining the response signal from the capacitively coupled signal comprises processing the captured capacitively coupled signal according to a characteristic of a capacitive sensor that is used to capture the capacitively coupled signal.

14. A method according to claim 13, wherein processing the captured capacitively coupled signal according to a characteristic of a capacitive sensor comprises at least one of amplifying and digital signal processing the captured capacitively coupled signal according to a characteristic of the capacitive sensor.

15. A method according to claim 1, wherein generating a step signal on one of the at least one signal path comprises controlling a boundary scan (BSCAN) device to generate the step signal.

16. A method according to claim 1, wherein the method further comprises coordinating the generating of the step signal and the capturing of the capacitively coupled signal via a trigger signal.

17. A method according to claim 1, wherein the at least one signal path is pulled high, pulled low or pulled to a fixed voltage level, and wherein generating a step signal on one of the at least one signal path comprises putting the signal path from a logic level high or low to a tri-state state.

18. A tester for verifying the integrity of the electrical connection between at least one signal path of a substrate and at least one respective contact of a component mounted on the substrate, the tester comprising:

means for receiving a signal due to a step signal applied to one of the at least one signal path connected to a respective contact, the signal being one of a capacitively coupled signal and a response signal obtained from the capacitively coupled signal; and means for determining the integrity of the electrical connection from a characteristic of the signal.

19. A tester according to claim 18, further comprising means for generating the step signal on the signal path.

20. A tester according to claim 19, wherein the means for generating the step signal comprises a means for controlling a BSCAN device to generate the step signal.

21. A tester according to claim 18, wherein the means for receiving the signal comprises a means for receiving the signal upon the receipt of a trigger signal indicating the generation of the step signal on the signal path.

22. A tester according to claim 18 further comprises means for obtaining the response signal from the capacitively coupled signal, and wherein the means for determining the integrity of the electrical connection from a characteristic of the signal comprises a means for determining the integrity of the electrical connection from a characteristic of the response signal.

23. A tester according to claim 22, wherein means for obtaining the response signal from the capacitively coupled signal comprises a means for obtaining one of an under-damped, an over-damped and a critically-damped signal from the capacitively coupled signal.

24. A tester according to claim 22, further comprising a capacitive sensor that captures the capacitively coupled signal, and wherein the means for obtaining the response signal from the capacitively coupled signal comprises a means for processing the captured capacitively coupled signal according to a characteristic of the capacitive sensor.

25. A tester according to claim 24, wherein the means for processing the captured capacitively coupled signal according to a characteristic of a capacitive sensor comprises at least one of a means for amplifying the captured capacitively coupled signal according to a characteristic of the capacitive sensor and a means for carrying out digital signal processing on the captured capacitively coupled signal according to the characteristic of the capacitive sensor.

* * * * *